United States Patent [19]

Jung

[11] Patent Number: 5,025,886

[45] Date of Patent: Jun. 25, 1991

[54] MULTI-PORTED AND MULTI-DIRECTIONAL LOUDSPEAKER SYSTEM

[76] Inventor: Gin K. Jung, 93-7 3GA Jung Ang Dong, Iri-City, Junbuk 570-120, Rep. of Korea

[21] Appl. No.: 531,660

[22] Filed: Jun. 1, 1990

[51] Int. Cl.⁵ ............................................. H05K 5/00

[52] U.S. Cl. .................................. 181/156; 181/196; 381/156

[58] Field of Search ............... 181/153, 155, 156, 196, 181/197, 148; 381/152, 156, 159

[56] References Cited

U.S. PATENT DOCUMENTS

| | | | |
|---|---|---|---|
| 2,228,886 | 1/1941 | Olson | 181/158 |
| 3,993,162 | 11/1976 | Juuti | 181/156 |
| 4,616,731 | 10/1986 | Robinson | 181/153 X |
| 4,655,315 | 4/1987 | Saville | 181/153 |
| 4,930,596 | 6/1990 | Saiki et al. | 181/156 X |

FOREIGN PATENT DOCUMENTS

| | | | |
|---|---|---|---|
| 0061871 | 1/1944 | Denmark | 181/148 |

*Primary Examiner*—Brian W. Brown
*Attorney, Agent, or Firm*—Pennie & Edmonds

[57] ABSTRACT

This invention relates to a loudspeaker having a plurality of sound collecting tubes attached to the rear of the speaker frame or the sound collecting tubes forming the speaker frame for collecting and directing sound waves emitted toward the rear of the speaker diaphragm. The sound collecting tubes are particularly useful for directing and boosting sound waves emitted from the rear of the speaker which is otherwise dissipated or absorbed by the loudspeaker housing material or insulation. In addition, conventional or specialized sound horns may be readily attached to the outlet end of the sound collecting tubes which can direct sound waves emitted by the speaker to any desired direction.

24 Claims, 4 Drawing Sheets

FIG. 6
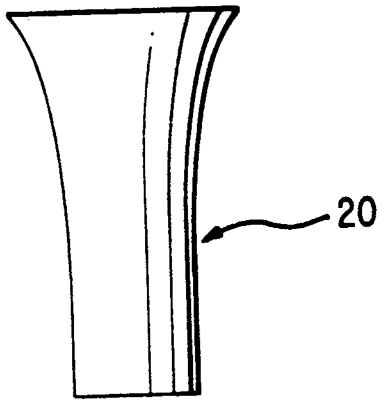
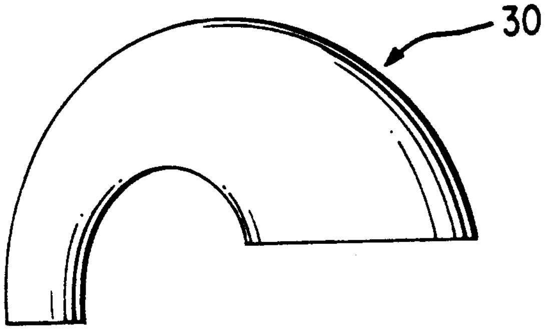
FIG. 7
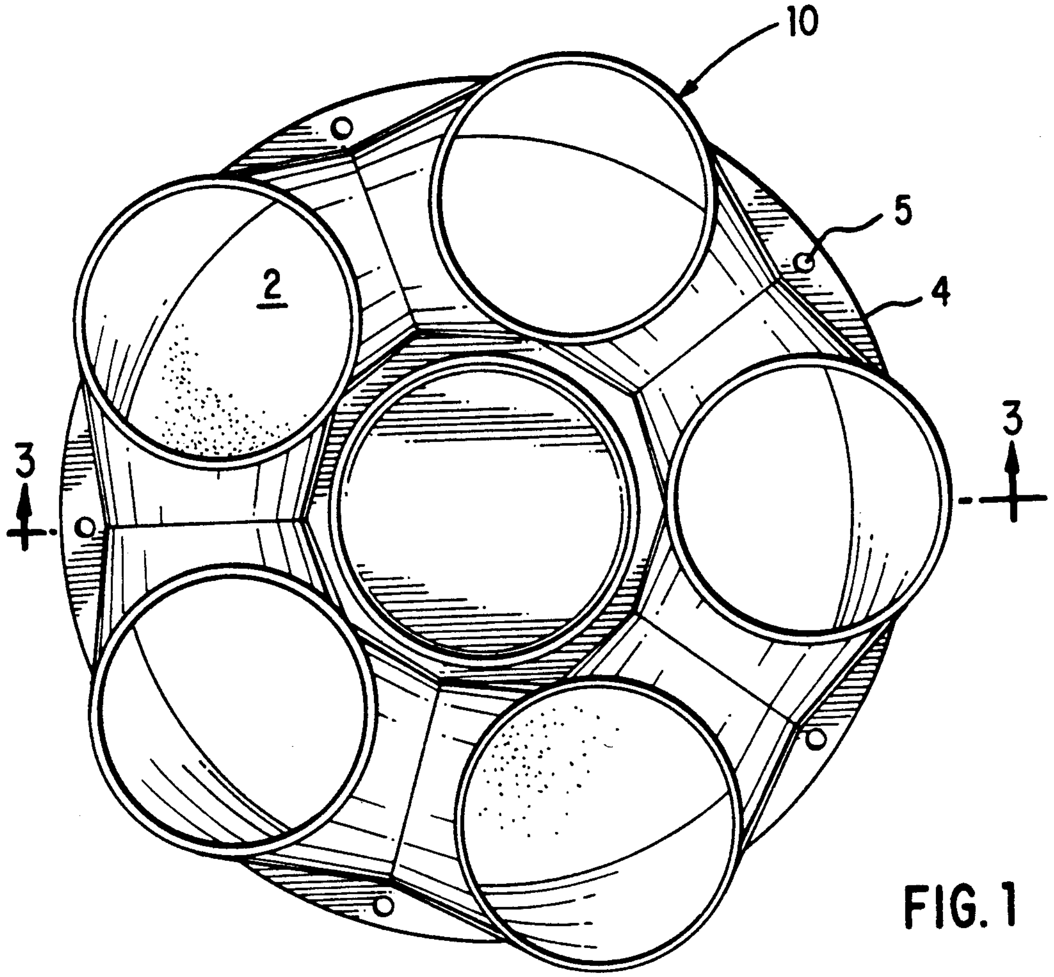
FIG. 1

MULTI-PORTED AND MULTI-DIRECTIONAL LOUDSPEAKER SYSTEM

BACKGROUND OF THE INVENTION

1. Field of the Invention

This invention relates to a novel loudspeaker system having at least one ported sound directing and focusing tube attached to the back of a conventional speaker frame. In another embodiment at least one tube forms a speaker frame for supporting a speaker diaphragm.

2. Description of the Prior Art

In the prior inventions, attempts have been made to design an efficient loudspeaker system capable of accurately reproducing original high-fidelity sound. Specifically, attempts have been made in two areas of the loudspeaker system: improvement in the loudspeaker cone and diaphragm utilizing modern technology, i.e., improved materials, and improvement in the housing to reduce unwanted vibration and resonation within the housing. A loudspeaker system utilizing or manipulating sound waves directed toward the rear of the speaker has been proposed, for example, in U.S. Pat. Nos. 4,439,644 to Bruney, III, 4,524,846 to Whitby, and 4,807,293 to Weckler.

In U.S. Pat. No. 4,439,644 to Bruney, III (Bruney), a loudspeaker system utilizes a plurality of vinyl sheets having different thicknesses to seal the rear of a speaker housing, to relieve pressure behind the loudspeaker driver, and to attenuate sound waves emitted toward the rear of the speaker. While this type of system minimizes the housing vibration and generation of the spring-like compression effect or the resonant boosting effect often associated with an acoustic suspension enclosure, the speaker is not as efficient as a ported speaker system in general. By contrast, the present invention relates to porting the rear of a speaker system to amplify or concentrate sound waves which are emitted toward the rear of the speaker and to selectively direct the sound waves at any direction.

In U.S. Pat. Nos. 4,524,846 to Whitby and 4,807,293 to Weckler, a loudspeaker system directs sound waves radiated rearwardly into the chamber(s) in the housing through convoluted path. This type is known to provide a good reputable performance. However, due to sound waves colliding against baffles stationed in the housing, resonance in the baffle and the housing cannot be avoided when driving at high levels, thus minimizing the high fidelity capability. By contrast, the present invention provides sound collecting tubes which are directly attached to the speaker frame or which form the speaker frame. In the present invention there are no baffle or medium which can cause resonation or unwanted sound reflections within the speaker housing. Sound waves passing through the tubes are freely "breathable". In other words, pressure build-up behind the speaker and sound reflections within the confines of the speaker housing, which cause undesirable sound distortion, are avoided or at least minimized by routing sound waves through the tubes.

SUMMARY OF THE INVENTION

This invention relates to a novel loudspeaker system where multiple sound collecting and concentrating tubes are formed in the back of the speaker frame to capture sound waves otherwise dissipated by the insulation material in the speaker housing or sound waves otherwise reflected by baffles and/or walls within the housing. Specifically, the area of the speaker frame which supports the diaphragm in the back of the speaker is minimized to prevent sound waves emitted toward the rear of the speaker from reflecting off the frame and back into the diaphragm. This maximizes the utilization of sound waves emitted from the rear of the speaker diaphragm and in return maximizes the efficiency and the high-fidelity capability of the speaker. The cross-sectional area of each tube at the inlet is equal to or slightly greater than that at the outlet. The tube is further shaped in the form of a cylinder toward the outlet. Moreover, at the outlet end of each tube, different types of horns can be attached and the horns can be variably positioned to direct sound waves emitted from the back of the speaker at any direction. The horn can be in the shape of brass instruments or sound amplifying horns which collect and concentrate sound waves passing therethrough. Essentially, the horn prevents sound waves from dispersing radially, and instead concentrates sound waves to a specific direction. A person standing in line with the direction of the attached horn thus hears the sound louder.

Accordingly, one object of my invention is to provide a loudspeaker capable of efficiently and accurately reproducing high fidelity sound by providing at least one sound collecting and concentrating tube at the back of the speaker diaphragm.

Another object of the invention is to provide at least one sound collecting and concentrating tube forming the speaker frame for supporting the speaker diaphragm.

Another object of the invention is to provide a loudspeaker capable of selectively directing the output of sound waves emitted toward the rear of the speaker at any direction.

Another object of the invention is to provide a loudspeaker capable of removably and adjustably attaching at least one sound concentrating device, which can be selectively directed at any direction, to the back of the speaker.

The advantage gained with my invention is that one loudspeaker unit with the aforementioned horn devices attached at the output ends of the sound collecting tubes can provide a performance equivalent to two to six conventional loudspeaker units, and thus the overall cost of the loudspeaker system can be significantly reduced. Moreover, because sound waves arrive simultaneously through all the sound collecting tubes, evenly balanced sound is heard.

The foregoing invention and features and advantages of my invention will be better appreciated from the following description.

BRIEF DESCRIPTION OF THE DRAWINGS

FIG. 1 is rear view of a loudspeaker of the present invention with five sound collecting tubes attached to the speaker.

FIGS. 6 and 7 are differently configured horns that can be attached to the outlet end of each sound collecting tube.

DETAILED DESCRIPTION OF THE PREFERRED EMBODIMENT

Figure 4:
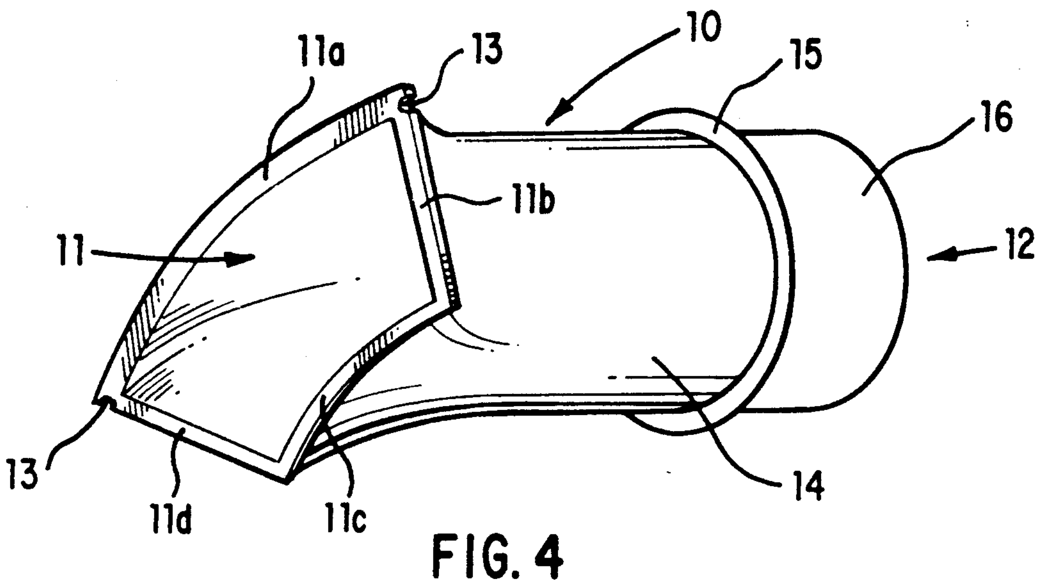
FIG. 4 is a detailed perspective view of one of the five identical sound collecting tubes.
Figure 2:
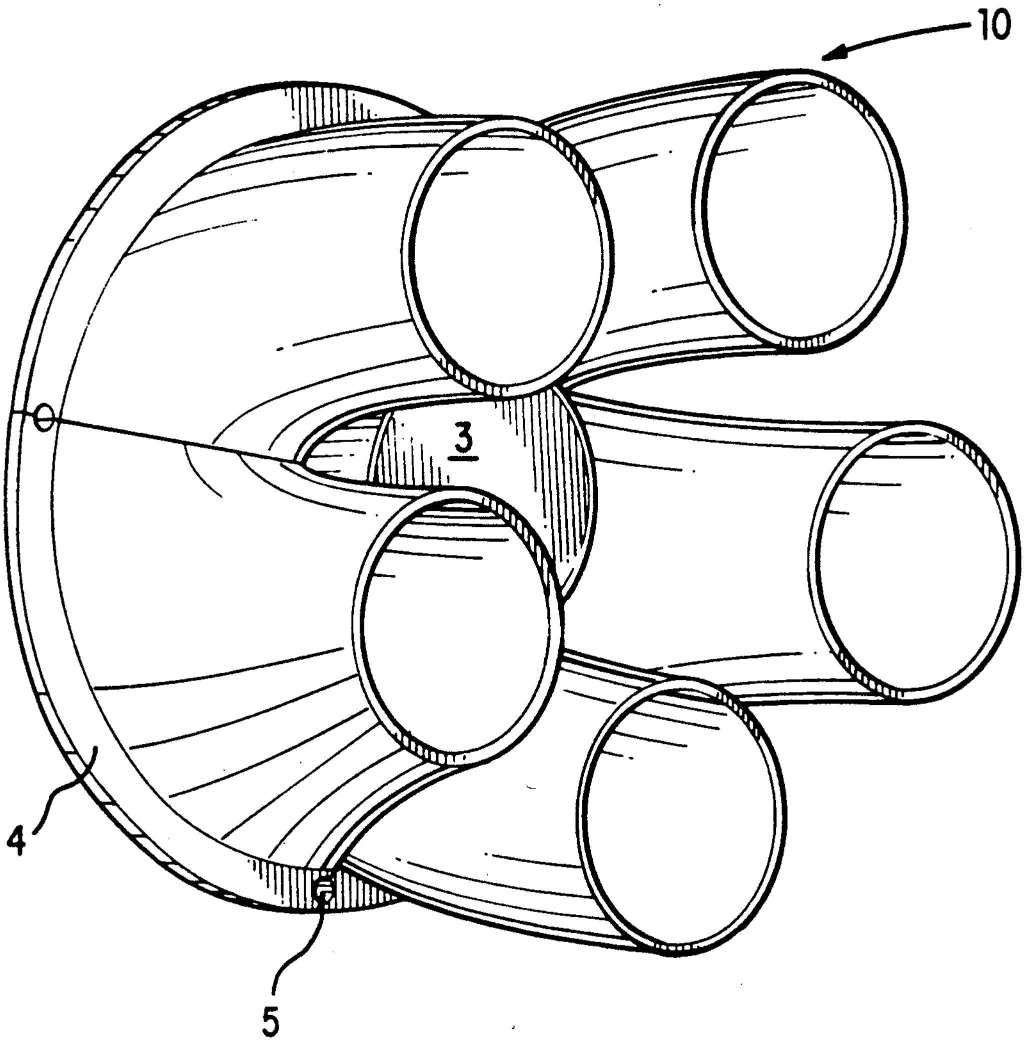
FIG. 2 is a perspective view of the of the speaker with the five sound collecting tubes shown more clearly.
Figure 5:
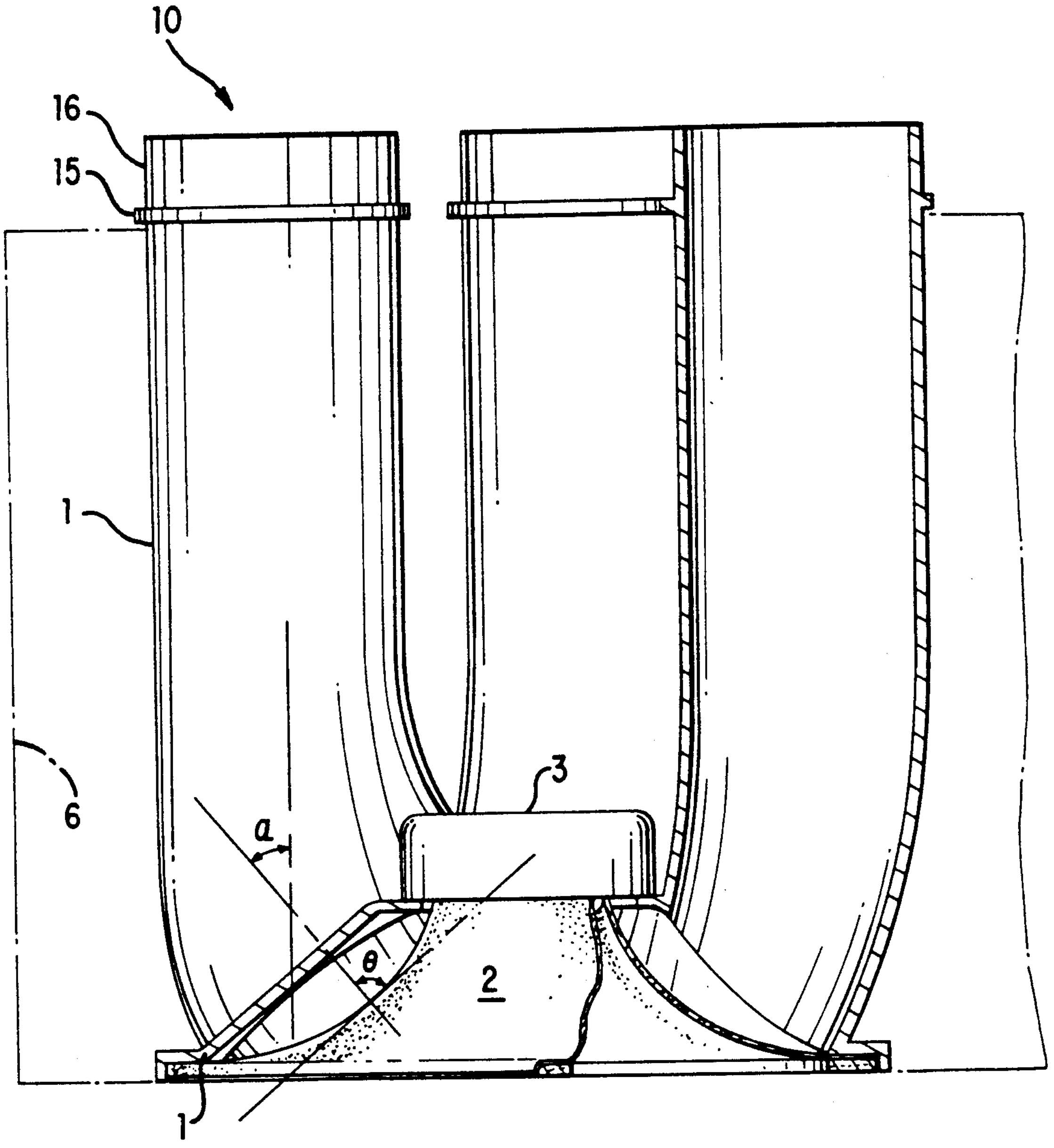
FIG. 5 is a second embodiment of a cross-sectional view of the loudspeaker, as indicated by 3—3 of FIG. 1, showing the sound collecting tube forming the speaker frame.

FIGS. 1 and 2 show a new and improved loudspeaker of the present invention with five identical sound collecting tubes (10) formed on the back of a conventional loudspeaker. Moreover, while the embodiments of the present invention are shown with the five sound collecting tubes, it is to be noted that any feasible number of sound collecting tubes can be used instead. Also, to facilitate better understanding of the present invention and to make the drawings less complex, horn attaching means (15, 16) have not been shown in FIGS. 1 and 2. The sound collecting tube in its entirety is shown in FIGS. 3-5.

Figure 3:
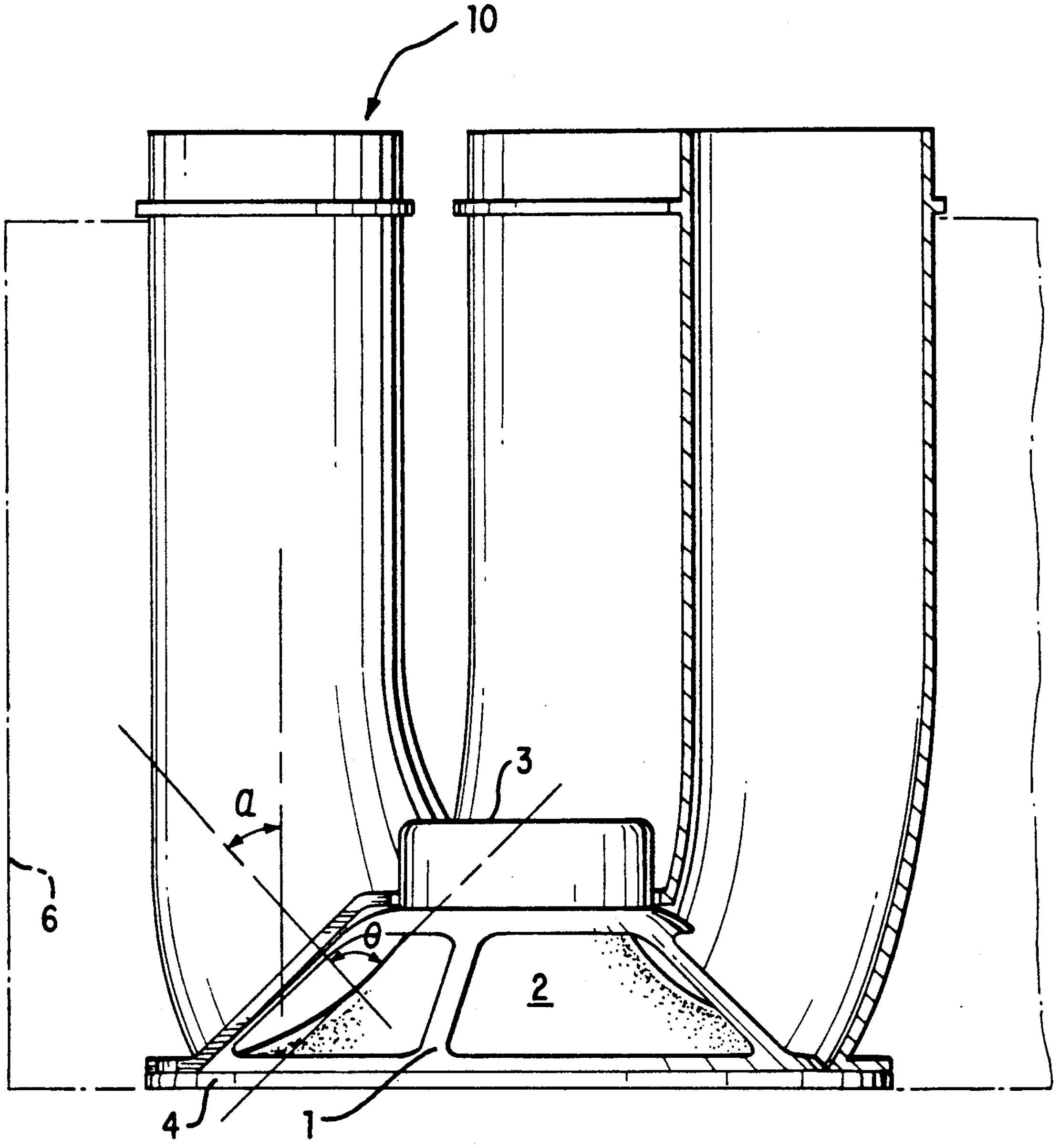
FIG. 3 is a first embodiment of a cross-sectional view of the loudspeaker, as indicated by 3—3 of FIG. 1, showing the sound collecting tubes attached to the speaker frame.

In the first: embodiment of the present invention, the loudspeaker comprises a diaphragm (2), a cone shaped frame (1) with a plurality of trapezoidal cut-outs to permit each sound collecting tube to be positioned directly concentric with one of the trapezoidal cut-outs as shown more clearly in FIG. 3. Thus, in the first embodiment, there are five trapezoidal cut-outs in the frame. If four sound collecting tubes are used instead, only four cut-outs are needed, and so on. The frame further includes a plurality of openings (5) to permit fastening devices such as screws, bolts, or rivets to be positioned therein. Note that each sound collecting tube has a pair of semi-circular cut-outs (13) at the sides which are aligned with any two openings (5) of the frame. The sound collecting tubes are fastened to the frame by any said conventional fastening means, and adhesive or double sided tape is preferably and additionally may be used to securely and sealingly fasten the tubes to the frame.

FIG. 2 shows a perspective view of the sound collecting tubes attached to the loudspeaker frame. It is apparent from FIG. 2 that each sound collecting tube at the inlet end (11) has a slightly greater cross-sectional area than that of the outlet end (12), with the outlet end having a cylindrical shape. The inlet end of the tube has a curved trapezoidal cross-sectional shape which is gradually and smoothly transformed into a cylindrical cross-sectional shape, forming a cylindrical tube at the outlet end. The cross-sectional area of the inlet end of the tube can also be equal to the outlet end. It is to be understood and noted that the inlet end of the tube corresponds to the back of the speaker unit and the specific shape of the inlet end has been designed to permit maximum flow of sound waves through the tube without any interference from any extraneous objects placed therebetween.

FIG. 3 shows a cut-away view of the first embodiment, as indicated by 3—3 of FIG. 1, with the loudspeaker and the sound collecting tubes arrangement shown more in detail. The chained lines (6) represent a conventional loudspeaker housing unit. Note that the speaker (1) is mounted to the housing by a conventional mounting method with the front of the speaker exposed to the ambient surrounding and the outlet ends of the sound collecting tubes also exposed to the ambient surrounding facing the rear of the speaker housing unit.

The longitudinal axis of each sound collecting tube is positioned at angle 0, approximately orthogonally (90 degrees), at the inlet end with respect to the diaphragm of the loudspeaker and gradually bent at angle a, approximately at 30 degrees, as shown clearly in FIG. 3. However, it is to be noted that the sound collecting tubes need not be positioned as described and shown. Rather, the sound collecting tubes can be positioned at any angle with respect to the diaphragm as long as the angle of the tube does not cause interference with sound waves emitted from the rear of the speaker. In other words, the sound collecting tubes should be positioned at an angle so that sound waves emitted from the rear of the speaker does not reflect off the respective inner walls of the tubes.

FIG. 4. shows one of the five identical sound collecting tube in more detail. The inlet (11) is shaped as a curving trapezoid with sides (11*a*, 11*b*, 11*c*, 11*d*). The trapezoidal shape corresponds to the trapezoidal shape openings in the loudspeaker frame. The inlet sides (11*a*, 11*b*, 11*c*, 11*d*) sealingly engage the loudspeaker frame. The area of the loudspeaker frame immediately adjacent to and contiguous with the diaphragm is maintained as small as possible to prevent sound waves emitted toward the frame from reflecting off the frame. The sound collecting tubes are formed such that when all the sound collecting tubes are mounted to the frame, the outer sides (11*a*) of the inlet end form a circle corresponding to the outer-circular flange (4) of the loudspeaker frame, and the openings (5) are aligned with the semi-circular cut-outs (13) of the sound collecting tubes. Similarly, the inner sides (11*c*) substantially conform with the outer diameter of a magnetic housing (3).

At the outlet end (12) of the sound collecting tube, horn attaching means (15, 16) is provided to permit conventional horns to be attached thereto. The horn can be attached to the outlet end by conventional tube attaching devices such as clamps, nut-bolt mating devices, or frictional fittings. The tube is also provided with an enlarged circular flange (15) which can act as a limit stop to abut the edge of the horn that engages the outlet end of the sound collecting tube. The length of the sound collecting tube is preferably one-half to twice the radius of the loudspeaker diaphragm to maximize sound waves emitted toward the rear of the speaker and to enable the reproduction of high fidelity sound.

FIG. 5 shows a cross-sectional view of the second embodiment of the loudspeaker, as indicated by 3—3 of FIG. 1, with the sound collecting tubes forming the speaker frame (1). The construction of the second embodiment is virtually identical to the first embodiment. As the description relating to the first embodiment, as shown by FIG. 1-4 and previously described above, applies equally to the second embodiment with the differences noted below, detailed description of the sound collecting tubes of the second embodiment is not deemed necessary. Thus, it is to be understood that the inlet ends of the sound collecting tubes are similarly shaped as the inlet ends of the first embodiment and the inlet sides (11*b*, 11*d*) are integral with the inlet sides (11*d*, 11*b*) of the adjacent sound collecting tubes to form a truncated cone shaped supporting frame (1) for supporting the diaphragm (2).

One major difference between the second embodiment and the first embodiment is that the speaker in the second embodiment does not have a separate speaker frame. Rather, the sound collecting tubes form the speaker frame (1) for supporting the speaker diaphragm (2). In other words, the sound collecting tubes are the speaker frame.

As previously discussed above, the area of the speaker frame, which supports the diaphragm (2) in the back of the speaker, should be minimized to prevent sound waves emitted toward the rear of the speaker from undesirably reflecting within the sound collecting tubes and the diaphragm. By having the sound collecting tubes formed as a speaker frame, sound back-up pressure and sound reflections occurring within the sound collecting tubes are substantially avoided since there is no separate speaker frame to interfere with sound waves passing therethrough. In other words, sound waves emitted toward the rear of the speaker freely passes directly through the collecting tubes without any extraneous objects restricting the passage of sound waves passing therethrough.

FIGS. 6 and 7 merely illustrate differently configured horns that can be connected to the outlet end of each tube of the first and second embodiments. The horns can be any conventional type. The horns are readily interchangeable to enable the listener to use different types of horns depending on the music and the listener's taste of sound. Note that different horns can produce different sound timbre which changes the tone of the sound. The horn (20) is a straight line type for directing sound waves opposite to the front of the speaker. This type of horn is useful in instances where the sound needs to be directed toward the front and back of the speaker. The horns can also direct sound waves to a wall or angled walls for reflecting the sound waves back toward the front or the sides of the speaker. The curved horn (30) can be used to direct sound waves toward the front or the side of the speaker without the use of walls or equivalent sound reflecting means.

The foregoing description is only illustrative of the principle of my invention. It is to be understood that the invention is not limited to the exact configuration and construction as illustrated and described herein. Accordingly, all expedient modifications may be made within the scope and spirit of my invention. For example, the sound collecting tube need not be limited to five tubes. The number of tubes can depend on the diameter of the loudspeaker or as matter of listeners preference.

I claim:

1. A loudspeaker system comprising:

(a) a loudspeaker having a diaphragm having a frontal side which is exposed to an ambient surrounding and a back side which is facing opposite said frontal side; and a supporting means for supporting said diaphragm and facing said back side of said diaphragm, said supporting means forming a plurality of openings to permit sound waves emitted by said diaphragm in a direction toward the rear of said loudspeaker to pass therethrough; and (b) at least two elongated sound collecting tubes formed with said supporting means and over said openings for passage of said sound waves which are emitted toward the rear of the speaker, whereby said sound collecting tubes direct sound waves passing therethrough out into said ambient surrounding.

2. A loudspeaker system according to claim 1, whereby said plurality of sound collecting tubes are integrally formed with said supporting means, and said supporting means forms a corresponding number of openings, each of said plurality of sound collecting tubes being formed over one of said openings in said supporting means.

3. A loudspeaker system according to claim 1, whereby five sound collecting tubes are integrally formed with said supporting means, and said supporting means forms a corresponding number of openings, each of said plurality of sound collecting tubes being formed over one of said openings in said supporting means.

4. A loudspeaker system according to claim 2 or 3, wherein said sound collecting tubes are integrally formed with each other and form said supporting means, said sound collecting tubes forming said openings.

5. A loudspeaker system according to claim 1, wherein each sound collecting tube is integrally formed with said supporting means and aligned with one of said openings.

6. A loudspeaker system according to claim 4, wherein each sound collecting tube includes a sound horn at a respective outlet end thereof.

7. A loudspeaker system according to claim 5, wherein each sound collecting tube includes a sound horn at a respective outlet end thereof.

8. A loudspeaker system according to claim 2 or 3, wherein said sound collecting tube comprises an inlet end, said inlet end having a shape corresponding to the back side of said diaphragm, and an outlet end having a cylindrical configuration.

9. A loudspeaker system according to claim 8, wherein the inlet ends of said sound collecting tubes integrally form said supporting means.

10. A loudspeaker system according to claim 8, wherein each inlet end has a curved trapezoidal cross-section, said curved trapezoid cross-section is gradually and smoothly transformed into a circular cross-section toward said outlet end to form said cylindrical configuration.

11. A loudspeaker system according to claim 8, wherein each inlet end is disposed about orthogonally to the back side of said diaphragm.

12. A loudspeaker system according to claim 11, wherein said outlet end is disposed about 30 degrees with respect to the inlet end.

13. A loudspeaker system according to claim 8, wherein a cross-sectional area of said inlet end is equal to or slightly greater than a cross-sectional area of said outlet end.

14. A loudspeaker system according to claim 12, wherein said outlet end comprises means for detachably and adjustably attaching a sound horn.

15. A loudspeaker system according to claim 14, wherein each sound collecting tube ranges in length from one-half to twice the radius of said diaphragm.

16. A loudspeaker system according to claim 15, further comprising a straight horn attached to each outlet end to direct said sound waves toward the rear of the loudspeaker.

17. A loudspeaker system according to claim 15, further comprising a curved horn attached to each outlet end to direct said sound waves toward the side or the front of the speaker.

18. A loudspeaker system comprising:

(a) a loudspeaker having a diaphragm with a frontal side and a back side which is facing opposite said frontal side, and a supporting means for supporting said diaphragm and facing said back side of said diaphragm, said supporting means having at least two openings to permit sound waves emitted by said diaphragm in the direction toward said back side to pass therethrough;

(b) a loudspeaker housing for mounting said loudspeaker with the frontal side of the diaphragm exposed to the ambient surrounding, (c) at least two sound collecting tubes formed with said supporting means over said at least two openings for routing sound waves emitted by said diaphragm in the direction toward the rear of said speaker and into said at least two sound collecting tubes, whereby said at least two sound collecting tubes direct said sound waves which are emitted toward the rear of the speaker directly through said at least two sound collecting tubes to the ambient surrounding without said sound waves dispersing in said housing.

19. A loudspeaker system according to claim 18, whereby said plurality of sound collecting tubes are integrally formed with said supporting means, and said supporting means forms a corresponding number of openings, each of said plurality of sound collecting tubes being formed over one of said openings in said supporting means.

20. A loudspeaker system according to claim 19, wherein said sound collecting tubes are integrally formed with each other and form said supporting means, said collecting tubes forming said openings.

21. A loudspeaker system according to claim 19, wherein each of said sound collecting tubes are attached to said supporting means and aligned to one of the respective openings.

22. A loudspeaker system according to claim 19, 20, or 21, wherein each sound collecting tube includes a means for detachably and adjustably connecting at least one sound horn at an outlet end of said each sound collecting tube.

23. A loudspeaker system according to claim 22, further comprising a straight horn to direct said sound waves toward the rear of the loudspeaker.

24. A loudspeaker system according to claim 22, further comprising a curved horn to direct said sound waves toward the side or the front of the loudspeaker.

* * * * *